(12) United States Patent
Rowland et al.

(10) Patent No.: US 6,980,140 B1
(45) Date of Patent: Dec. 27, 2005

(54) FLASH ADC RECEIVER WITH REDUCED ERRORS

(75) Inventors: Andy Rowland, Kanata (CA); Tom Luk, Ottawa (CA); Sevgui Hadjihassan, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/870,054

(22) Filed: Jun. 18, 2004

(51) Int. Cl.$^7$ .............................................. H03M 1/06
(52) U.S. Cl. .................. 341/118; 341/94; 341/158; 341/159; 714/704; 714/795; 714/798; 714/799
(58) Field of Search ........................... 369/59.2–59.29; 375/219, 316, 317, 341; 341/118, 120, 158, 341/159; 714/704, 795, 798–799

(56) References Cited

U.S. PATENT DOCUMENTS

| | | | |
|---|---|---|---|
| 4,823,360 A * | 4/1989 | Tremblay et al. ........... 375/214 |
| 5,606,540 A * | 2/1997 | Hayashi .................... 369/59.21 |
| 5,663,945 A * | 9/1997 | Hayashi et al. ........... 369/47.35 |
| 5,809,071 A * | 9/1998 | Kobayashi et al. ......... 375/229 |
| 5,896,391 A * | 4/1999 | Solheim et al. ............. 714/704 |
| 5,944,844 A * | 8/1999 | Piirainen et al. ............ 714/704 |
| 6,097,769 A * | 8/2000 | Sayiner et al. .............. 375/341 |
| 6,307,899 B1 * | 10/2001 | Starr et al. .................. 375/340 |
| 6,603,416 B2 * | 8/2003 | Masenas et al. ............ 341/120 |
| 6,618,436 B2 * | 9/2003 | Greiss et al. ............... 375/229 |
| 6,735,259 B1 * | 5/2004 | Roberts et al. ............. 375/316 |
| 6,735,724 B1 * | 5/2004 | McClellan ................... 714/704 |
| 6,877,117 B1 * | 4/2005 | Childers et al. ............ 714/704 |
| 6,894,985 B2 * | 5/2005 | Billhartz .................... 370/252 |
| 2004/0030965 A1 * | 2/2004 | Hadjihassan et al. ....... 714/704 |
| 2004/0091273 A1 * | 5/2004 | Brissette et al. ............ 398/175 |

* cited by examiner

*Primary Examiner*—Peguy JeanPierre
*Assistant Examiner*—Khai M. Nguyen
(74) *Attorney, Agent, or Firm*—Max R. Wood; Ogilvy Renault LLP

(57) ABSTRACT

Symbol decoding errors at a receiver utilising a flash analog to digital converter (ADC) can be reduced by adjusting a reference voltage level of the ADC where a decoding error rate at the reference voltage level exceeds a threshold.

16 Claims, 6 Drawing Sheets

| Bit Sequence | Voltage Slicing level | | | | | | | | |
|---|---|---|---|---|---|---|---|---|---|
| | 0.0 | 0.2 | 0.4 | 0.6 | 0.8 | 1.0 | 1.2 | 1.4 |
| 000 | $2*10^{-3}$ | $1*10^{-1}$ | $1*10^{-2}$ | $5*10^{-6}$ | $1*10^{-6}$ | $1*10^{-7}$ | $1*10^{-7}$ | $1*10^{-8}$ |
| 001 | $8*10^{-5}$ | $6*10^{-2}$ | $3*10^{-2}$ | $1*10^{-5}$ | $1*10^{-6}$ | $1*10^{-7}$ | $1*10^{-7}$ | $1*10^{-8}$ |
| 010 | $1*10^{-8}$ | $1*10^{-7}$ | $1*10^{-5}$ | $7*10^{-3}$ | $3*10^{-2}$ | $1*10^{-3}$ | $1*10^{-6}$ | $1*10^{-7}$ |
| 011 | $1*10^{-8}$ | $1*10^{-7}$ | $1*10^{-6}$ | $2*10^{-3}$ | $4*10^{-2}$ | $7*10^{-4}$ | $2*10^{-6}$ | $1*10^{-7}$ |
| 100 | $1*10^{-7}$ | $2*10^{-4}$ | $4*10^{-2}$ | $1*10^{-6}$ | $3*10^{-5}$ | $1*10^{-6}$ | $1*10^{-7}$ | $1*10^{-8}$ |
| 101 | $1*10^{-7}$ | $8*10^{-5}$ | $3*10^{-2}$ | $8*10^{-3}$ | $1*10^{-4}$ | $1*10^{-6}$ | $1*10^{-7}$ | $1*10^{-8}$ |
| 110 | $1*10^{-8}$ | $1*10^{-8}$ | $1*10^{-7}$ | $5*10^{-6}$ | $5*10^{-3}$ | $2*10^{-2}$ | $4*10^{-4}$ | $1*10^{-6}$ |
| 111 | $1*10^{-8}$ | $1*10^{-8}$ | $1*10^{-7}$ | $1*10^{-6}$ | $2*10^{-3}$ | $3*10^{-2}$ | $1*10^{-3}$ | $2*10^{-6}$ |

FIG. 3

FLASH ADC RECEIVER WITH REDUCED ERRORS

BACKGROUND

This invention relates to the reduction of decoding errors when using a flash analog to digital converter.

Telecommunications typically involves communicating a bit stream over a channel. At the sending end, the bit stream is typically encoded as an analog signal for transmission over the channel. At a receiver, the bit stream is decoded from the received analog signal. A real-world channel will impart distortions to the signal. It is the function of the receiver to endeavour to accurately recover the bit stream despite these distortions.

Where a bit stream is encoded as an analog modulated (AM) signal, at the receiver, after removal of any carrier wave, the signal may pass through an analog to digital decoder (ADC). One known type of ADC is a flash ADC which uses a set of $2^n - 1$ comparators to directly measure the received analog signal to a resolution of n bits. For example, a three bit flash ADC will have seven comparators, each of which compares an input voltage with a different pre-set reference voltage level in order to "slice" the received analog voltage into one of eight levels. In use, the analogue input signal is sampled at a clock rate reflective of the bit rate of the bit stream on the channel. Each sample then represents one bit in the bit stream. For each sample, the voltage level of the sample inputs each comparator. The outputs from the comparators will indicate that the voltage of the sample lies between two reference voltages. In this way, the sample voltage may be digitised to the level of the lower of these two reference voltages. The digitised voltage then passes to an equaliser which attempts to address channel distortion in determining, based on the digitised voltage, whether the sample represents a binary 0 or a binary 1.

One significant cause of channel distortions results from temporal spreading of the signal when propagating over long distances or over nonlinear medium. This phenonenon is not effectively addressed by known equalisers. Therefore, the current invention seeks to provide an improved equalisation approach.

SUMMARY OF THE INVENTION

Symbol decoding errors at a receiver utilising a flash analog to digital converter (ADC) can be reduced by adjusting a reference voltage level of the ADC where a decoding error rate at the reference voltage level exceeds a threshold.

In accordance to one aspect of the present invention, there is provided a receiver comprising: a flash analog to digital converter (ADC) which receives inputs from a channel and a reference voltage adjuster; a symbol decoder which receives input from said ADC; a link quality indicator, which receives input from said symbol decoder and generates link quality indications therefrom; and the reference voltage adjuster, which receives input from said ADC and the link quality indications from the link quality indicator, and responsive thereto outputs to a control input of said ADC selectively adjusting one or more reference voltages of said ADC.

In accordance to another aspect of the present invention, there is provided a receiver comprising: a flash analog to digital converter (ADC); decoding means responsive to said ADC to decode symbols; link quality detecting means responsive to said decoding means to detect symbol decoding errors; means responsive to said ADC and said symbol decoding errors for adjusting reference voltages of said ADC.

In accordance to a further aspect of the present invention, there is provided in a receiver utilising a flash analog to digital converter (ADC), a method of improving link quality comprising: where a link quality at a voltage slicing level of said ADC does not meet a threshold, adjusting a reference voltage for said voltage slicing level.

Other features and advantages will become apparent after referring to the following description in conjunction with the drawings.

BRIEF DESCRIPTION OF THE DRAWINGS

In the figures which illustrate example embodiments of the invention,

FIG. 3 illustrates an exemplary look up table.

DETAILED DESCRIPTION

Figure 1:
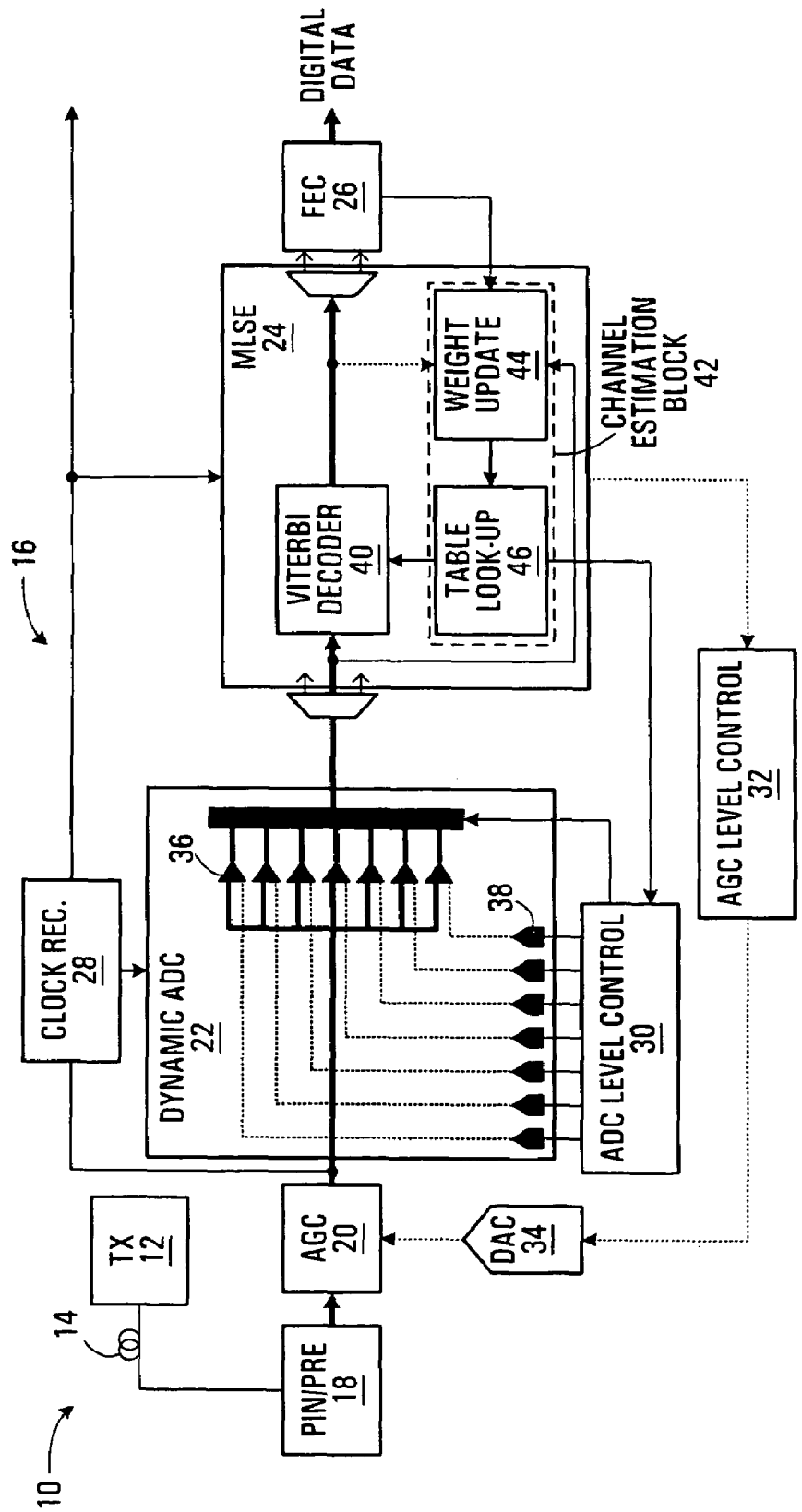
FIG. 1 is a schematic view of a transmission system including a receiver made in accordance with this invention.

Tuning to FIG. 1, a transmission system 10 comprises a transmitter 12, a channel 14, and a receiver 16. The channel may be, for example, an optical channel on an optical fibre. The receiver may comprise a serially arranged preprocessing block 18, adaptive gain controller (AGC) 20, flash ADC 22, equaliser 24, and forward error corrector (FEC) 26 as a link quality indicator. A clock recovery block 28 may recover a clock signal upstream from the ADC and input the recovered clock to the ADC and the equaliser. The equaliser may output to an ADC level controller 30 which inputs reference voltages to the ADC 22. The equaliser 24 may also output to an AGC level controller 32, which in turn outputs to the AGC 20 through a digital to analog converter (DAC) 34. Each of the preprocessor 18, AGC level controller 32, and AGC 20 operate in a conventional manner and so is not further described herein.

As illustrated, the flash ADC 22 has ($2^3-1=$) seven comparators 36, each input by any signal at the AGC 20. The seven comparators also receive one of seven reference voltages from the ADC level control 30 via a DAC 38.

The equaliser 24 may be a maximum likelihood sequence estimating (MLSE) equaliser. As is understood by those skilled in the art, an MLSE equaliser has a Viterbi Decoder 40 as a symbol decoder and a channel estimation block 42. The channel estimation block has a look-up table 46. In accordance with this invention, the channel estimation block also has a weight update block 44. The weight update block 44 is a processing block; therefore, the weight update block may be, for example, a processor or a field programmable gate array (FPGA).

The Viterbi Decoder 40 receives the output from the ADC 22 and in turn outputs to the FEC 26 and to the weight update block 44. In one embodiment (described hereinafter), the weight update block 44 receives the output, of the Viterbi Decoder. The weight update block also receives the output from the ADC 22 and the FEC 26. The weight update block outputs to the look-up table 46. The look-up table 46 outputs to the Viterbi Decoder 40 and to the DAC Level Controller 30. For reasons which will become apparent, the channel estimation block 42 can act as an adjuster for the reference voltages of the ADC, and therefore serves as a reference voltage adjuster.

While any signal sample is supposed to represent only a single bit, in fact, due to temporal spreading, there will be inter symbol interference (ISI). The consequence of ISI is that the state (0 or 1) of the bits preceding and following the bit represented by the sample will affect the voltage level of the current bit. In essence, some of the power in preceding and following bits spreads into to the current bit, changing its voltage level. For this reason, it is common for an MLSE equaliser to operate on three bit sequences (i.e., it is assumed that the ISI results from the bit before and the bit after the current bit). Therefore, in the following example, a three bit sequence is used to adjust for ISI.

In a first embodiment, the look up table 46 may store a plurality of possible channel impulse response models, one of which is designated as the initial impulse response model. The weight update block 44 may determine from the initial channel model the probability density functions (pdf's) for each of the eight possible three sequence combinations (from 000 to 111). The look up table also stores an initial set of voltage slicing levels which may be loaded into block 44. Block 44 then determines a probability for each of the possible three sequence combinations at each of the voltage slicing levels. The probability chosen for a sequence at a given voltage slicing level may be the maximum probability for that sequence in the range between the given voltage slicing level and the next higher voltage slicing level. Alternatively, it could be the average probability in that range. Since there are eight voltage slicing levels and eight three bit sequences, this will result in sixty-four probability values (weights) which are loaded into the 8×8 look-up table 44.

Figure 2:
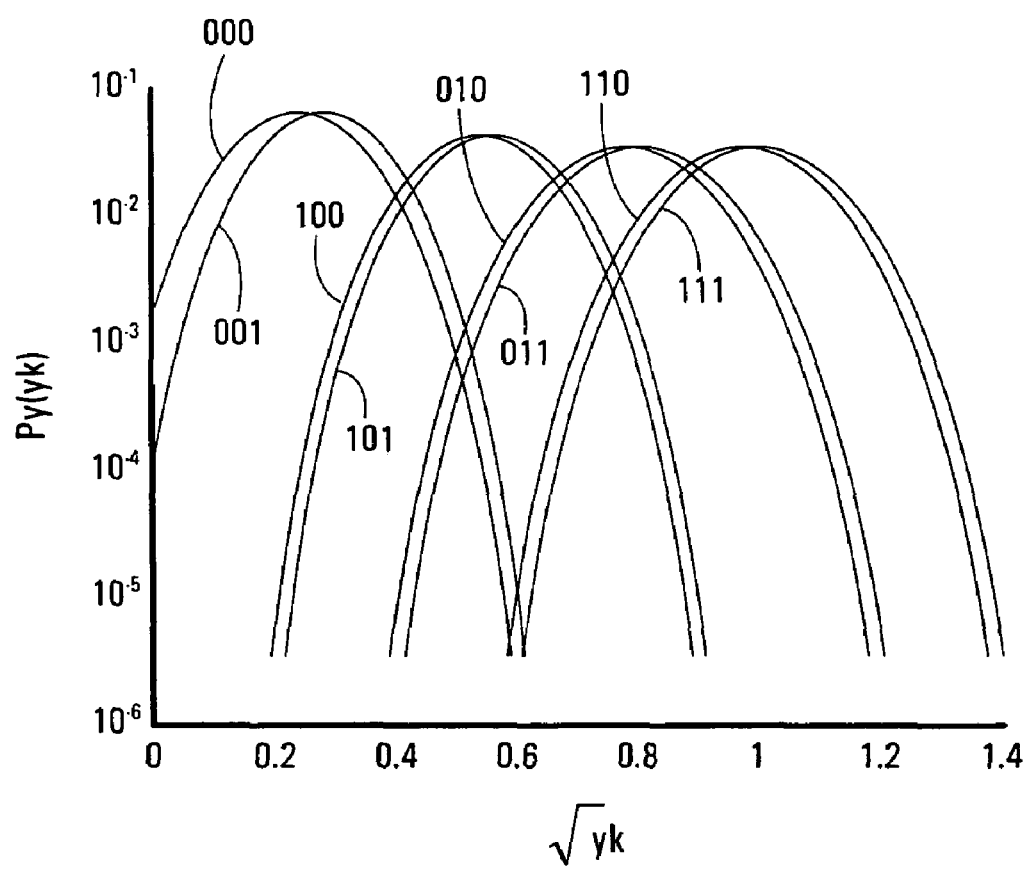
FIG. 2 is a graph of probability density functions (pdf's)

FIG. 2 is a graph of the eight pdf's that might have been generated from the channel model. As is understood, each pdf indicates the probability, $P_y$, that, given the voltage, $y_k$, of any received signal sample, that voltage is indicative of a given three bit series of bits. As shown in FIG. 2, the pdf's are presented as the square root of the voltage against the log of the probability a given voltage represents a given bit sequence.

Assuming that the eight voltage slicing levels are 0.0; 0.2; 0.4; 0.6; 0.8; 1.0; 1.2; and 1.4, a table 46 illustrated in FIG. 3 may be generated from the graph of FIG. 2. Each cell in the table has a probability weight, this probability weight being the log of the probability value at a given slicing level for a given bit sequence.

In a manner well understood by those skilled in the art, the Viterbi decoder 40, input with the voltage slicing level of each sample, stores a pre-set number of consecutive (voltage) samples in a buffer. The decoder also has a matrix having eight rows, one for each of the eight possible three bit sequences, and one column for each storage location in the buffer.

Figure 4:
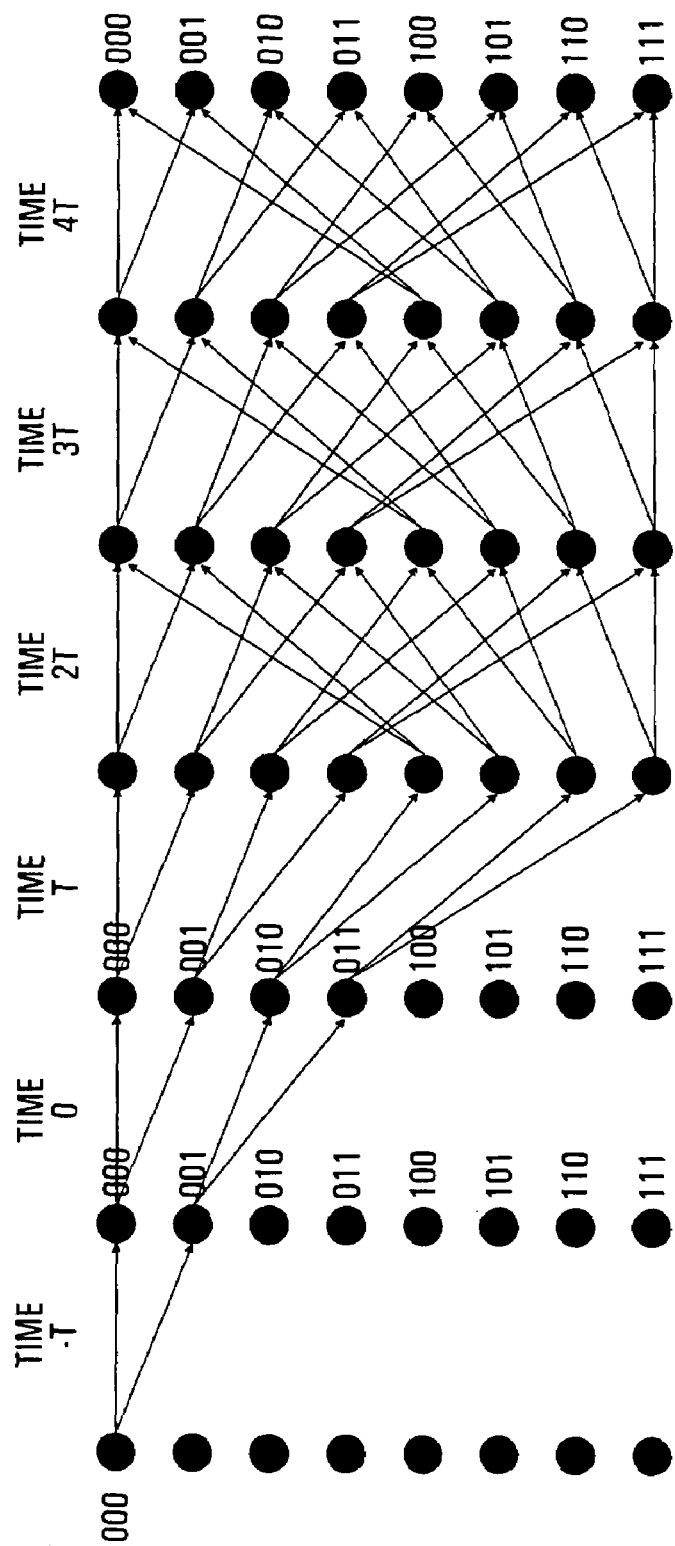
FIG. 4 illustrates an exemplary trellis in a Viterbi decoder.

Say, for example, the buffer is seven samples long (actual buffers are likely to be much longer). Thus, the matrix in the decoder will be an 8×7 matrix, as illustrated in FIG. 4. Next assume that the voltage levels of the first four consecutive samples are received into the buffer (and that the voltage level of earlier samples is assumed to be 0). With these assumptions, FIG. 4 illustrates all possible paths through the matrix. These paths form what is known as a trellis.

Figure 5:
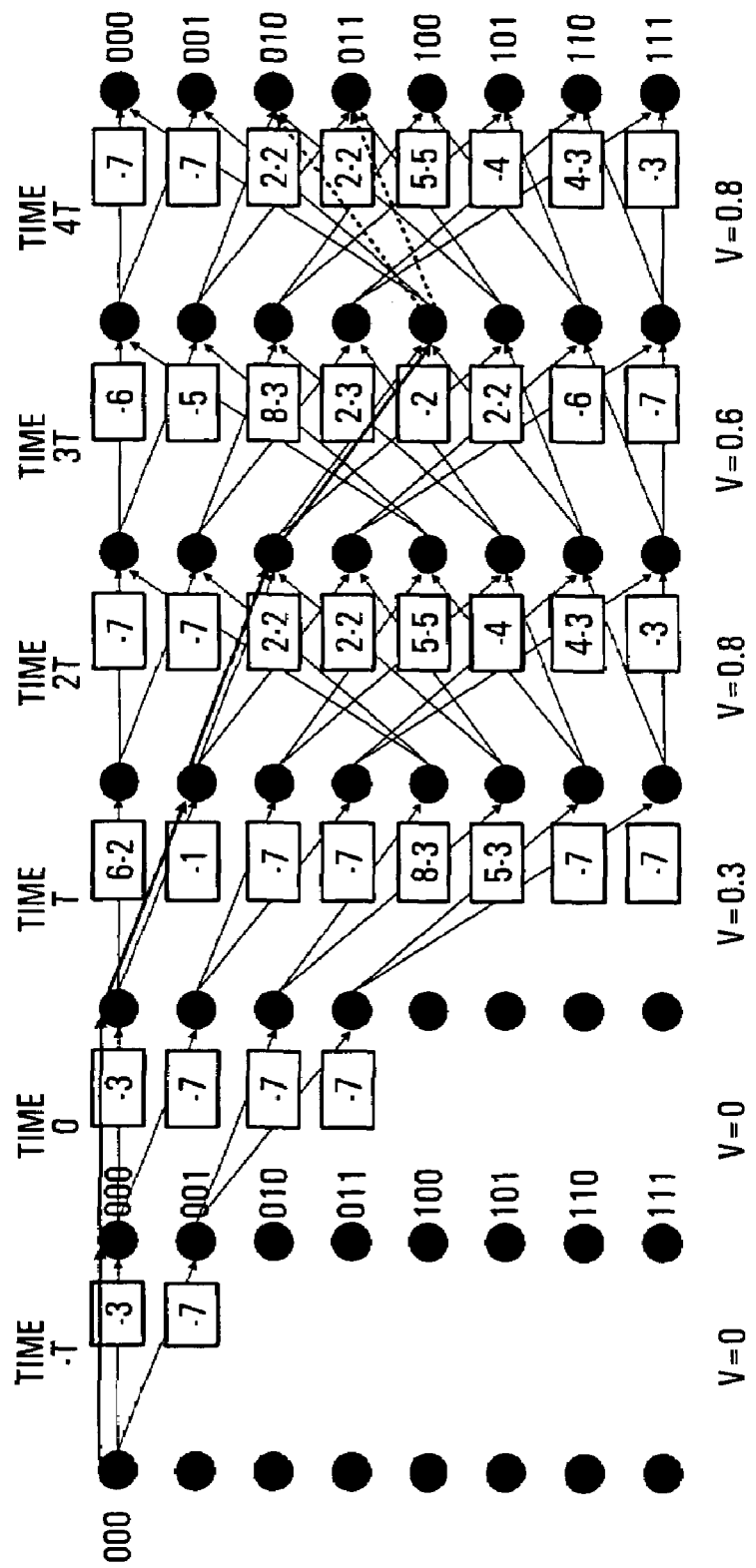
FIG. 5 illustrates the trellis of FIG. 4 with probability weights.

If the voltage levels of these first four samples are 0.2; 0.4; 0.6; and 0.8, with this (and the fact that earlier voltages are assumed to be zero), the decoder can load appropriate probabilities from the table 46 into the matrix. More specifically, the first three columns of the matrix are loaded with the eight probabilities assigned to the eight possible three bit sequences where the sample voltage is the zero slicing voltage. From FIG. 3 this is seen to be $10\char`\^-3, 10\char`\^-7, \ldots$ The next column is loaded with the eight probabilities for a 0.2 voltage slicing level, and so on. The result is illustrated in FIG. 5 (where, for ease of illustration, a short-hand notation has been used such that, for example, $10\char`\^-3$ is rendered as -3 are $6\char`\^*10\char`\^-2$ is rendered as 6-2).

The decoder then adds up the probabilities for each path through the trellis and the highest probability path is chosen. This results in an assumed bit sequence in the buffer. The decoder then outputs one bit, that being the bit represented by the oldest (first) voltage sample in the buffer. All samples are then shifted one position in the buffer so that the oldest sample is discarded from one end of the buffer and a new sample is received in the other end of the buffer. The probability values for the decoder matrix are then updated from the table, the most likely path chosen, and one bit is output. This process then repeats.

Some of the bits in the decoded (i.e., recovered) sequence may be error correction bits. These may be used by the FEC to correct errors.

Errors noted by the FEC block may be fed back to the weight update block 44. If the bit error ratio (BER) rises above an acceptable standard, the weight update block may tune a selected channel model parameter by selecting a slightly different channel model from the look up table to designate as an updated channel model. This updated channel model may assume, for example, a slightly different chromatics dispersion, polarization mode dispersion, modal dispersion, or Kerr effect. Pdf's generated from the updated channel model are then used to update the probability values stored in the look-up table 46. The new set of probability values varies the decisions made by the Viterbi decoder as to the maximum likelihood three bit sequences. This, in turn, affects the BER. If the BER goes down, the weight update block may further tune the selected channel model parameter. If the BER goes up, the weight update block may return the magnitude of the selected parameter to that of its preceding value by returning to a previous channel model. In this way, the BER may be minimized with respect to the selected parameter. If, notwithstanding, the BER remains too high, the weight update block may repeat the process for a further channel model parameter, and so on. In this way, the channel model may be blindly adapted, as the distortion on the channel changes with time.

An alternate embodiment may not employ FEC 26 in updating the channel model. In such instance, while the channel is operating, a given short sequence—say eight bits long—which is decoded from a sequence of input voltages is assumed to be free of errors. This is a reasonable assumption for a short sequence given the relatively low BER expected in a working channel. The weight update block 44 may take the decoded eight bit sequence output from the Viterbi decoder 40 and pass it through the current channel model in reverse direction. More specifically, using the probability density functions of the current channel model, each of the six different three bit sequences in the eight bit output sequence is assumed to have resulted from an input voltage corresponding to the maximum probability of that three bit sequence. The resulting (six) regenerated input voltages are then compared with the corresponding actual received input voltages. If there is a sufficiently strong correlation, the current channel model is assumed to be correct. If, however, the correlation is not sufficiently strong, the output sequence is passed through other channel models in reverse direction. If one of these other channel models provides a stronger correlation, that channel model is substituted as the current channel model.

Figure 6:
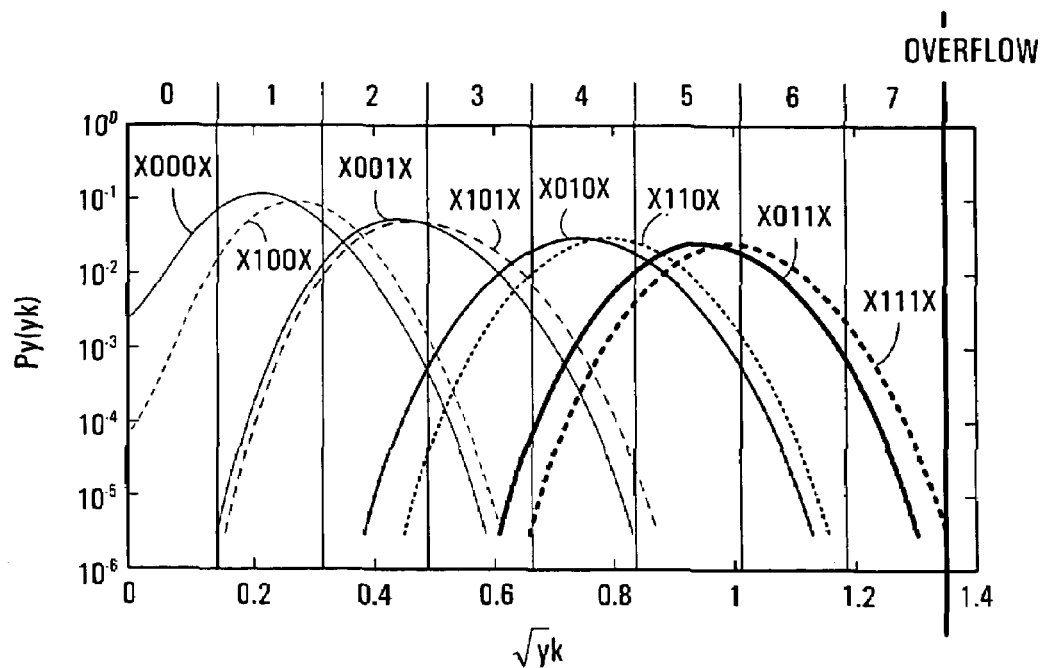
FIG. 6 and FIG. 7 are graphs of pdf's overlaid with voltage slicing levels of a flash analog to digital converter (ADC).

As illustrated in FIG. 6, in known arrangements, the reference voltages to the comparators of the flash ADC are fixed at equal increments. A drawback with this it that these increments may not allow discrimination between pdf's that are closely valued over the range of voltages represented by a voltage level. For example, with reference to FIG. 6, if the square root of an actual analogue voltage were 0.95, this would be represented as a level 5 voltage, with a nominal square root value of 0.85. At 0.85, the maximum likelihood sequence is 011. However, at 0.95, the maximum likelihood sequence is 110. Thus, the digitisation of the sample voltage may introduce errors. Even though these errors do not result from channel distortion, it may be possible to reduce these errors by adjusting the channel model (and thereby changing the pdf's). But even with such adjustments, errors resulting from the digitisation of the sample voltage will remain.

The subject invention may reduce these errors by adjusting the reference voltages dependent upon the channel model. More particularly, the weight update block 44 is input with the voltage level for each sample. With this information and the errors reported by the FEC, the weight update block can determine whether errors at a given voltage level are over represented. In other words, the error rate at a given voltage level may be determined to exceed a pre-defined threshold. In such instance, the weight update block may change the voltage slicing levels and send the new levels to the table 46. This will result in the table being updated with the new voltage slicing levels for use by the Viterbi decoder and in the table sending a control signal to the ADC level controller 30 with the new levels.

Figure 7:
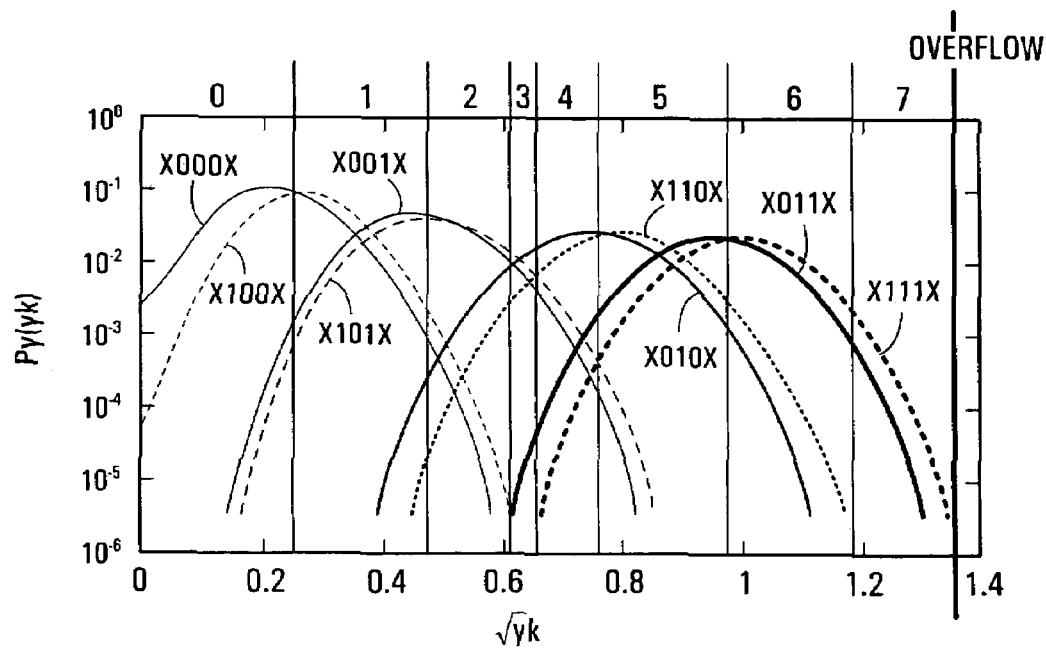

For example, with reference to FIG. 6, it will be noted that the exemplary pdf's for each of 100, 101, 010 and 011 all cross in the vicinity of a square root of the voltage of 0.65. Thus, sample voltages resolved to level 3 or level 4 voltages will introduce errors. Receiving indications of these errors at these levels, the weight update block may reduce the voltage bands covered by both level 3 and level 4 voltages. These bands may be reduced incrementally, with the bands continuing to reduce as long as reductions decrease the errors at these voltage levels. The result may be as illustrated in FIG. 7 with the level 3 voltage covering a very narrow band, and the level 4 voltage covering a somewhat narrowed band.

The adaptations are dynamic. Thus, if the characteristics of the channel change, the weight update block will update the channel model and the reference voltages in order to reduce errors.

In one approach, the weight update block may first attempt to minimize the BER by updating the channel model and then, once the channel model has been optimized, adapt the voltage slicing levels to further reduce the BER (at certain voltage slicing levels). This process may then be repeated periodically. In an alternate embodiment, whenever the weight update block 44 updates the channel model, from the resulting pdf's, it may calculate a set of voltage slicing levels which will minimize the BER at each voltage slicing level. This is done by, for example, reducing the step between voltage slicing levels sufficiently to maximize the discrimination between two or more pdf's that are closely valued between the slicing levels. In a further embodiment which will more quickly update the slicing level, known test sequences may be received and BER statistics may be collected on these known sequences. More specifically, the BER may be collected for each of the sequences from 000 to 111 and these statistics used to update the slicing levels. In this embodiment, the FEC is not used to determine the BERs, but instead the weight update model determines these, knowing the test sequences and the corresponding decoded sequences.

In another embodiment, the channel model may be static (i.e., the assumed pdf curves may be fixed), but the BER may nevertheless be reduced by adjusting the reference voltage levels of the ADC, as aforedescribed.

While the look up table has been described as storing a plurality of channel models, it could alternatively simply store the pdf's that result from each channel model, thereby obviating the need for the weight update block to calculate these.

While the weight update block has been described as making adjustments based on the BER, equally, it could make adjustments based on any other parameter which indicates link quality.

In another embodiment, the look up table does not store channel models; instead, the weight update block stores an initial channel impulse response model. In this embodiment, the weight update block receives the output from the Viterbi decoder. This output is passed through the channel model and the result compared with the original input to the Viterbi decoder (which is also stored in the weight update block). If there is a good match, the channel model is assumed to be correct. This may be assessed by calculating the mean squared error for a number of blindly adapted channel impulse response models that are similar to the current channel model. If one of these blindly adapted models provides a lower mean squared error, it is chosen as the updated channel model. The updated channel model is used to calculate pdf's in order to update the matrix (of FIG. 3) in the look up table 46. This process repeats as new output is received from the Viterbi decoder. The voltage slicing levels may be adapted as before described.

While the MLSE equaliser 24 has been described as decoding sequences of three bits, obviously sequences of a different number of bits, such as five bits, could be decoded. A five bit sequence would account for ISI not only for the bits immediately preceding and following a given bit, but also for the bit preceding the preceding bit and the bit following the following bit. While the channel 14 has been described as carrying an encoded bit stream to be decoded, more generally, the channel may carry an encoded symbol stream to be decoded.

While the equaliser 24 has been described as an MLSE equaliser, the equaliser may be any equaliser which can determine that the BER associated with certain voltage slicing levels is unacceptably high and can adjust such voltage slicing levels in an effort to reduce the BER associated with such voltage slicing levels. Thus, for example, the equaliser could be a Feed Forward Equaliser (FFE), a Decision Feedback Equaliser (DFE), a Fractionally Spaced Equaliser, or a combined FFE/DFE.

Other modifications will be apparent to those skilled in the art and, therefore, the invention is defined in the claims.

What is claimed is:
1. A receiver comprising:
a flash analog to digital converter (ADC);
a symbol decoder, which receives input from said ADC and operates on groups of bits of a fixed bit length, each group of bits comprising a target bit and bits adjacent in time to said target bit, said bits adjacent in time to said target bit being assumed to affect a voltage of said target bit before decoding due to inter-symbol interference;

a link quality indicator, which receives input from said symbol decoder and generates link quality indications therefrom; and reference voltage adjuster, which receives input from said ADC and the link quality indications from the link quality indicator and, responsive thereto outputs to a control input to said ADC for selectively adjusting one or more reference voltages of said ADC.

2. The receiver of claim 1 wherein said symbol decoder is a Viterbi decoder.

3. The receiver of claim 1 wherein said link quality indications indicate link quality at a voltage slicing level of said ADC and said reference voltage adjuster adjusts a reference voltage level associated with said voltage slicing level when said link quality indications do not meet a threshold quality level.

4. The receiver of claim 1 wherein said link quality indicator is an error detector.

5. The receiver of claim 4 wherein said reference voltage adjuster operates to adjust a given reference voltage when a rate of errors at a voltage slicing level of said ADC associated with said given reference voltage level exceeds a threshold.

6. The receiver of claim 4 wherein said error detector is a forward error corrector (FEC) having an output which inputs into said reference voltage adjuster.

7. The receiver of claim 4 wherein said error detector comprises a portion of said reference voltage adjuster.

8. The receiver of claim 1 wherein said reference voltage adjuster determines probability information comprising a probability of occurrence for all possible groups of bits of said fixed bit length for each of said reference voltages and wherein said probability information is output to said symbol decoder.

9. The receiver of claim 8 wherein said reference voltage adjuster holds a current channel impulse response model and said probability information is derived from said current channel impulse response model.

10. The receiver of claim 9 wherein said reference voltage adjuster updates said model, or selects a different model, responsive to indications from said link quality indicator.

11. A receiver comprising:
a flash analog to digital converter (ADC);
decoding means responsive to said ADC to decode symbols, said decoding means operating on groups of bits of a fixed bit length, each group of bits comprising a target bit and bits adjacent in time to said target bit, said bits adjacent in time to said target bit being assumed to affect a voltage of said target bit before decoding due to inter-symbol interference;
link quality detecting means responsive to said decoding means to detect symbol decoding errors; and
a channel estimation block responsive to said ADC and said symbol decoding errors for adjusting reference voltages of said ADC.

12. In a receiver utilising a flash analog to digital converter (ADC), a method of improving link quality comprising:
adjusting a reference voltage for a voltage slicing level of said ADC when a decoding error rate at said voltage slicing level exceeds said threshold wherein
decoding symbols on said link and determining said decoding error rate at said voltage slicing level, said decoding comprising operating on groups of bits of a fixed bit length, each group of bits comprising a target bit and bits adjacent in time to said target bit, said bits adjacent in time to said target bit being assumed to affect a voltage of said target bit before decoding due to inter-symbol interference.

13. The method of claim 12 wherein said determining said decoding error rate at said voltage slicing level utilises error correction bits in a received bit stream.

14. The method of claim 12 wherein said determining said decoding error rate at said voltage slicing level comprises receiving known test sequences and comparing said test sequences with corresponding decoded sequences.

15. The method of claim 12 further comprising deriving probability information from an assumed channel impulse response model, said probability information comprising a probability of occurrence for all possible groups of bits of said fixed bit length at each said voltage slicing level of said ADC.

16. The method of claim 15 wherein said probability information is used to decode said symbols.

* * * * *